United States Patent
Yao et al.

(10) Patent No.: US 12,308,297 B2
(45) Date of Patent: May 20, 2025

(54) SEMICONDUCTOR PACKAGE SYSTEM AND RELATED METHODS

(71) Applicant: SEMICONDUCTOR COMPONENTS INDUSTRIES, LLC, Phoenix, AZ (US)

(72) Inventors: Yushuang Yao, Seremban (MY); Chee Chew, Seremban (MY); Atapol Prajuckamol, Rayong (TH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 211 days.

(21) Appl. No.: 17/660,319

(22) Filed: Apr. 22, 2022

(65) Prior Publication Data

US 2022/0246486 A1    Aug. 4, 2022

Related U.S. Application Data

(62) Division of application No. 15/136,605, filed on Apr. 22, 2016, now Pat. No. 11,342,237.

(Continued)

(51) Int. Cl.
*H01L 21/56* (2006.01)
*H01L 21/52* (2006.01)
(Continued)

(52) U.S. Cl.
CPC ............ *H01L 23/053* (2013.01); *H01L 21/52* (2013.01); *H01L 23/49811* (2013.01); *H01L 24/49* (2013.01); *H01L 24/85* (2013.01); *H01L 25/0655* (2013.01); *H01L 25/072* (2013.01); *H01L 25/18* (2013.01); *H01L 25/50* (2013.01); *H01L 24/48* (2013.01); *H01L 2224/48091* (2013.01); *H01L 2224/48227* (2013.01); *H01L 2924/00014* (2013.01); *H01L 2924/01014* (2013.01); *H01L 2924/13055* (2013.01);

(Continued)

(58) Field of Classification Search
CPC ....... H01L 24/85; H01L 24/49; H01L 25/072; H01L 25/0655; H01L 21/565; H01L 21/54; H01L 21/9817
See application file for complete search history.

(56) References Cited

U.S. PATENT DOCUMENTS

| 5,291,178 A | 3/1994 | Strief et al. |
| 5,747,875 A | 5/1998 | Oshima |

(Continued)

FOREIGN PATENT DOCUMENTS

| DE | 69126714 T2 | 1/1991 |
| DE | 19758864 B4 | 12/1997 |

(Continued)

OTHER PUBLICATIONS

English Abstract, Corresponds to JPH04162554A, Retrieved from Internet [https://worldwide.espacenet.com] Aug. 24, 2017, 2 pages.

*Primary Examiner* — Hoa B Trinh
(74) *Attorney, Agent, or Firm* — IPTechLaw LLC

(57) ABSTRACT

Implementations of a semiconductor package may include: a substrate, a case coupled to the substrate and a plurality of press-fit pins. The press-fit pins are molded into and fixedly coupled with the case. The pins are also electrically and mechanically coupled to the substrate.

20 Claims, 6 Drawing Sheets

Related U.S. Application Data

(60) Provisional application No. 62/267,349, filed on Dec. 15, 2015.

(51) Int. Cl.
| | |
|---|---|
| *H01L 23/00* | (2006.01) |
| *H01L 23/053* | (2006.01) |
| *H01L 23/498* | (2006.01) |
| *H01L 25/00* | (2006.01) |
| *H01L 25/065* | (2023.01) |
| *H01L 25/07* | (2006.01) |
| *H01L 25/18* | (2023.01) |

(52) U.S. Cl.
CPC ............... *H01L 2924/13091* (2013.01); *H01L 2924/15738* (2013.01); *H01L 2924/15747* (2013.01)

(56) References Cited

U.S. PATENT DOCUMENTS

| | | | |
|---|---|---|---|
| 5,967,858 A | 10/1999 | Yamada | |
| 6,719,573 B2 | 4/2004 | Koehler et al. | |
| 7,494,389 B1 | 2/2009 | Essert et al. | |
| 2012/0295490 A1 | 11/2012 | Schneider | |
| 2014/0151868 A1* | 6/2014 | Bayerer | ............ H01L 24/80 |
| | | | 257/690 |
| 2014/0199861 A1 | 7/2014 | Mattiuzzo | |

FOREIGN PATENT DOCUMENTS

| | | |
|---|---|---|
| DE | 102009000490 A1 | 1/2009 |
| EP | 04162554 A | 10/1990 |
| EP | 0438165 B1 | 1/1991 |
| EP | 0513410 A1 | 5/1991 |

\* cited by examiner

SEMICONDUCTOR PACKAGE SYSTEM AND RELATED METHODS

CROSS REFERENCE TO RELATED APPLICATIONS

This application is a divisional application of the earlier U.S. Utility patent application to Yushuang Yao entitled "Semiconductor Package System and Related Methods," application Ser. No. 15/136,605, filed Apr. 22, 2016, which application claims the benefit of the filing date of U.S. Provisional Patent Application 62/267,349, entitled "Semiconductor Package System and Related Methods" to Yushuang Yao which was filed on Dec. 15, 2015, the disclosures of each of which are hereby incorporated entirely herein by reference.

BACKGROUND

1. Technical Field

Aspects of this document relate generally to semiconductors, such as power integrated modules. More specific implementations involve press-fit pins for connecting printed circuit board.

2. Background

Conventionally, to connect a substrate to another circuit board, press-fit pins have been used. Conventional method of manufacture involves using a fixture is used to hold the pins in place on the substrate during the soldering process. Following soldering, the case is conventionally attached separately from the pins.

SUMMARY

Implementations of a semiconductor package may include: a substrate, a case coupled to the substrate and a plurality of press-fit pins. The press-fit pins may be molded into and fixedly connected with the case. The pins may be electrically and mechanically coupled to the substrate.

Implementations of a semiconductor package may include one, all, or any of the following:

The case may have an opening having a strut that extends from a side of the opening to another side of the opening and a first set of a plurality of fingers extending from the strut on one side of the strut and a second set of a plurality of fingers extending from an opposing side of the strut.

A cover may be coupled to the case, the cover having a plurality of openings therethrough, the plurality of openings configured to receive the plurality of pins.

The case may have a cover with the plurality of pins molded into and fixedly coupled thereto, the cover having a potting opening therethrough.

A casing may be configured to be fixedly coupled over one or more edges of the cover and over at least a portion of the substrate.

The casing may have a plurality of locking projections that engage with the one or more edges of the cover and irreversibly lock the cover to the casing.

Implementations of a semiconductor package may be manufactured using implementations of a method of making semiconductor packages. The method may include providing a substrate, coupling one or more die to the substrate, coupling the die to the substrate using one or more connectors and providing a case. The method may also include molding into the case and fixedly coupling thereto a plurality of pins. The method may also include simultaneously electrically and mechanically coupling the plurality of pins and the case with the substrate. The method may also include dispensing a potting compound inside the case over at least a portion of the substrate.

Implementations of a method of making a semiconductor package may include one, all, or any of the following:

The case may have an opening having a strut that extends from a side of the opening to another side of the opening. The case may have a first set of a plurality of fingers extending from the strut on one side of the strut. The case may also have a second set of a plurality of fingers extending from an opposing side of the strut.

A cover may be included that may have a plurality of openings therethrough configured to receive the plurality of pins is coupled to the case.

The substrate may include at least one of copper, silicon, and any combination thereof.

The pins may be fixedly coupled to the substrate through soldering.

The one or more connectors may comprise a wire.

Semiconductor package implementations disclosed herein may be manufactured using another method of manufacturing a semiconductor package. The method implementations may include providing a substrate, coupling one or more die to the substrate and coupling the die using one of more connectors. The method may also include providing a cover for a case, the cover having a potting opening therein. The method may also include molding into the cover and fixedly coupling thereto a plurality of pins. The method may also include simultaneously electrically and mechanically coupling the plurality of pins and the cover to the substrate. The method may also include coupling a casing over the cover and to the substrate. The method may also include dispensing a potting compound into the case through the potting opening in the cover.

Implementations of a method of making a semiconductor package may include one, all, or any of the following:

A temporary fixture may be used to hold the cover and the substrate together while coupling the plurality of pins and the cover to the substrate.

A plurality of locking projections on the casing may be included to mechanically and irreversibly lock the cover with the casing.

The substrate may include at least one of copper, silicon or any combination thereof.

The pins may be fixedly coupled to the substrate through soldering.

The one or more connectors may be made of a wire.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
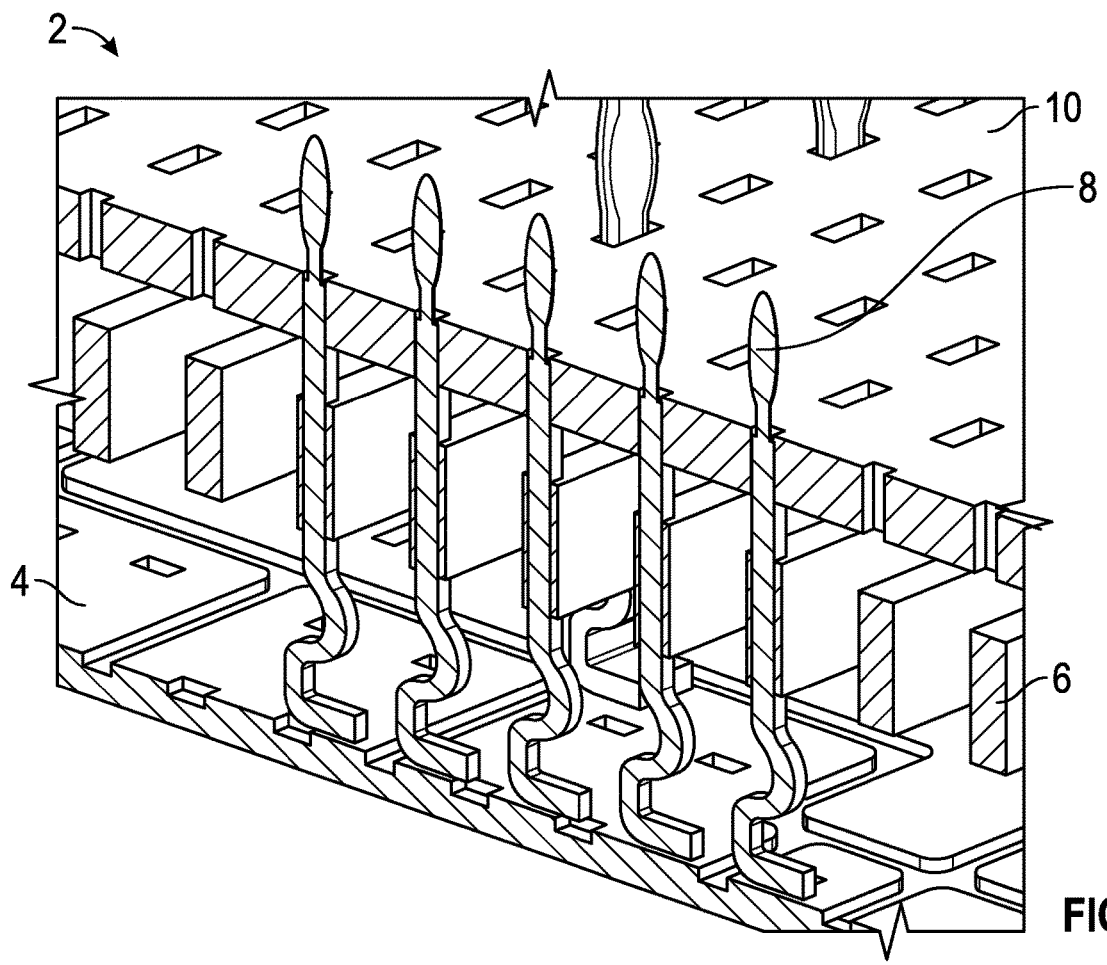
FIG. 1 is a perspective view of a plurality of press-fit pins molded into a case.

FIG. 1 illustrates a cross section view of a first implementation semiconductor package 2 where routing lines 4 are electrically and mechanically coupled to a plurality of press-fit pins 8. As illustrated, the plurality of press-fit pins are molded into a case having fingers 6. A cover 10 is encloses the package 2 and the plurality of pins fit through a plurality of openings in the cover.

Figure 2:
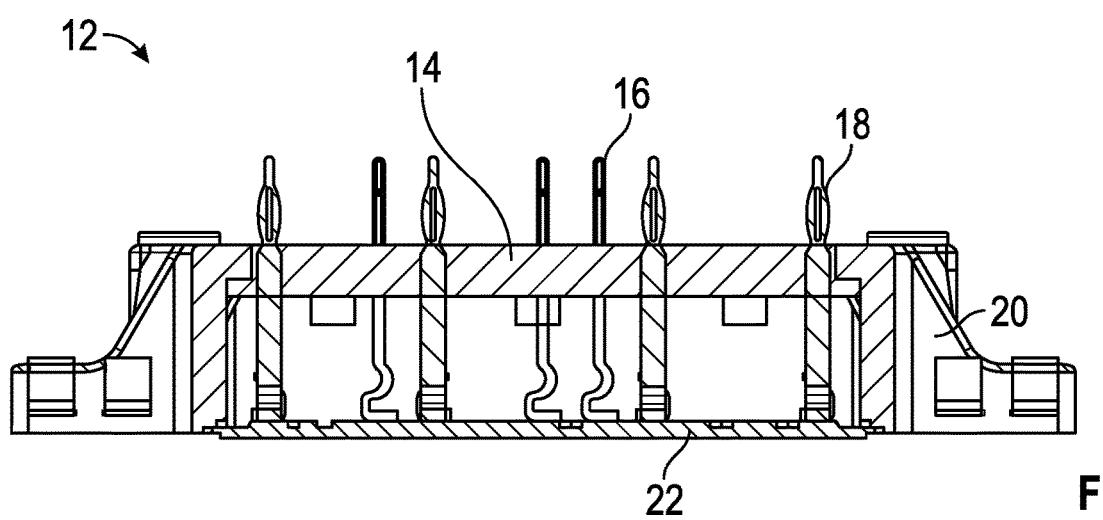
FIG. 2 is a side view of a plurality of press-fit pins molded into a cover.

Referring to FIG. 2, a second implementation of a semiconductor package 12 is illustrated. Differently oriented press-fit pins 16 and 18 are molded into and fixedly coupled to a cover 14 and enclosed in a case 20. The case 20 with a plurality of press-fit pins 16 and 18 and cover 14 is fixedly coupled to the substrate 22. Both first and second implementations of semiconductor packages disclosed herein may help to decrease stress on individual press-fit pins of the plurality of press-fit pins.

Figure 3A:
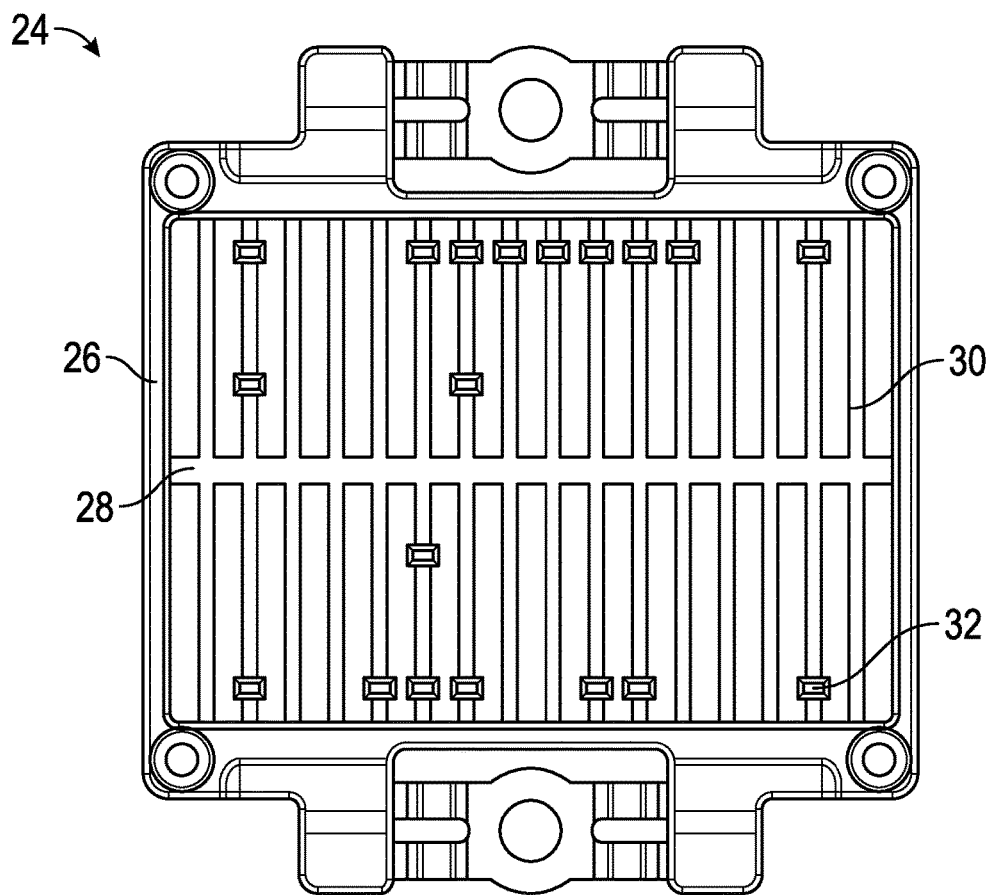
FIG. 3A is a top view of a plurality of press-fit pins molded into the fingers of a case.
Figure 3B:
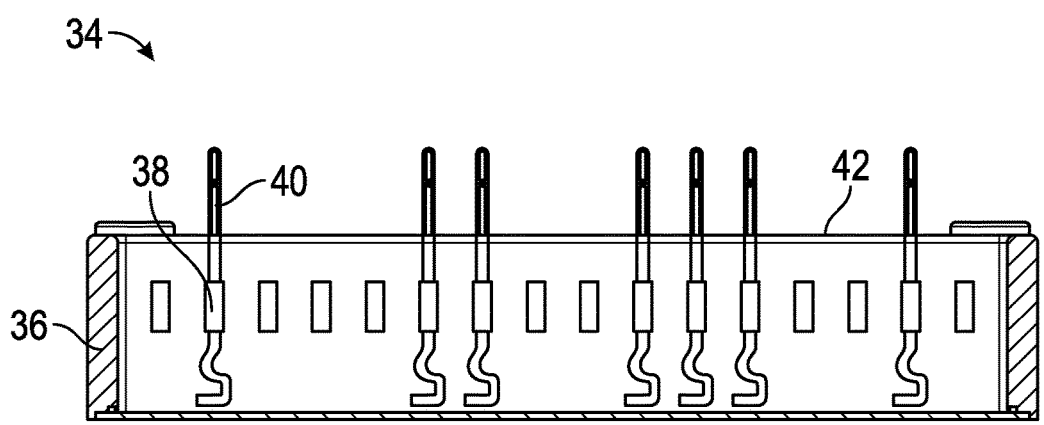
FIG. 3B is a cross-sectional view of a plurality of press-fit pins molded into the fingers of a case.

Referring to FIG. 3A, a top view of the first implementation of a semiconductor package 24 is illustrated. The case 26 has an opening therein where a strut 28 extends from a side of the opening to another side of the opening. A first set of a plurality of fingers 30 extend from the strut 28 on one side of the strut 28 and a second set of a plurality of fingers 30 extend from an opposing side of the strut 28. The plurality of press-fit pins 32 are molded into the fingers 30 and held by the fingers 30. Referring to FIG. 3B, a cross-sectional view of an implementation of a semiconductor package 34 like that of FIG. 3A is illustrated. The case 36 encloses the fingers 38 which are molded around the plurality of press-fit pins 40. By non-limiting example a cover 42 may be subsequently added over the press-fit pins 40 embedded in the fingers 38. As can be seen in FIG. 3B, all of the press fit pins are oriented the same directly to allow them to be molded in to the fingers 30. In such implementations, this may allow all of the fingers to have the same size. In other implementations, however, the fingers may vary in width and size relative to each other to allow pins of differing orientations (and/or sizes) to be simultaneously molded into the fingers.

Figure 4A:
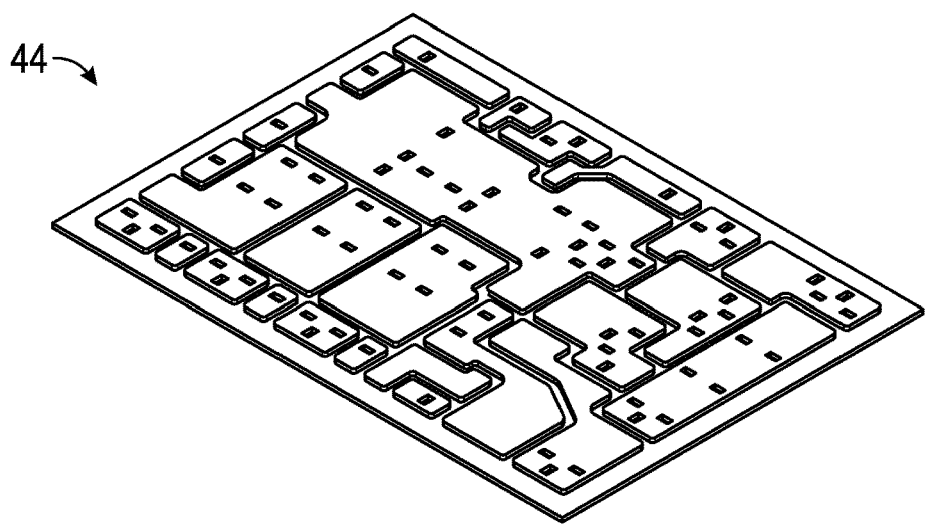
FIGS. 4A-4F shows an implementation of a method of making a semiconductor package with press-fit pins molded into fingers of a case.
Figure 4B:
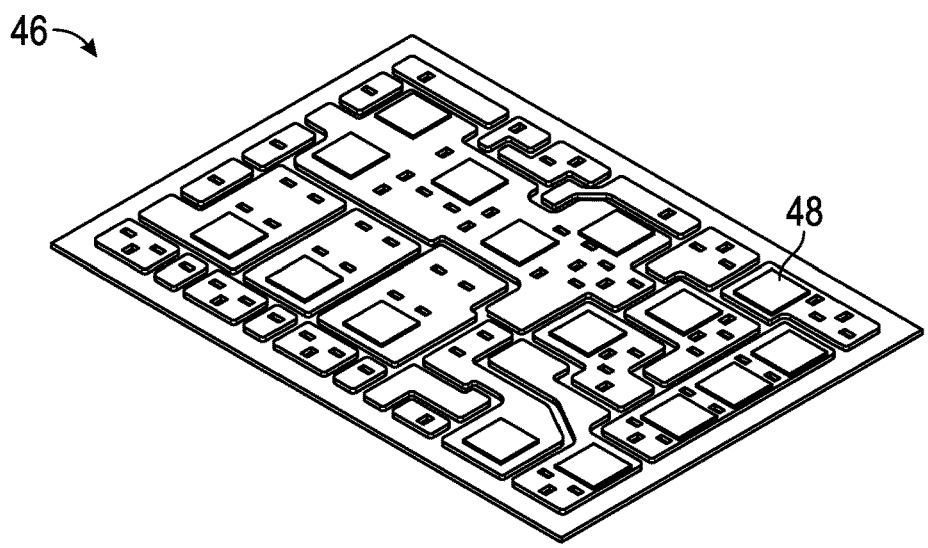
Figure 4C:
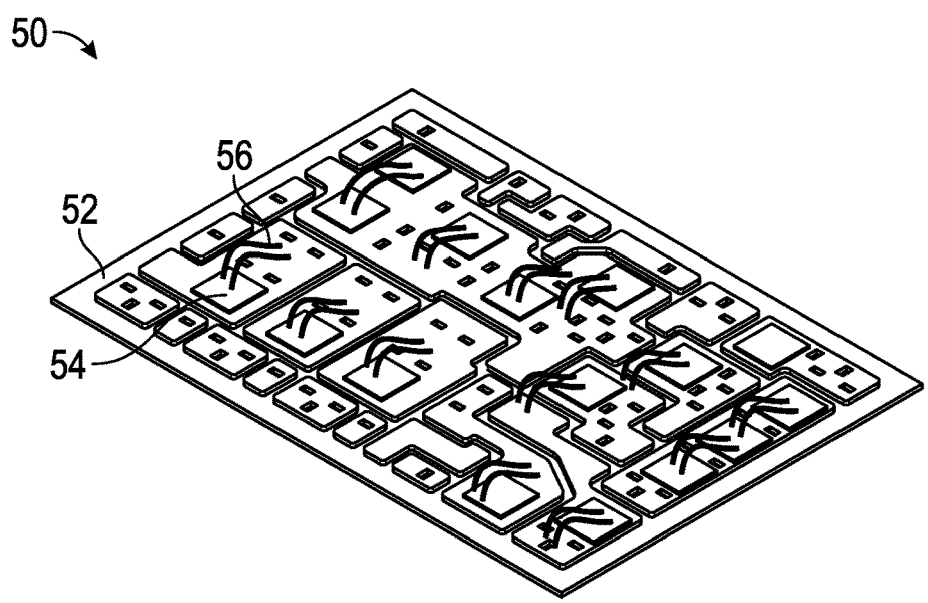
Figure 4D:
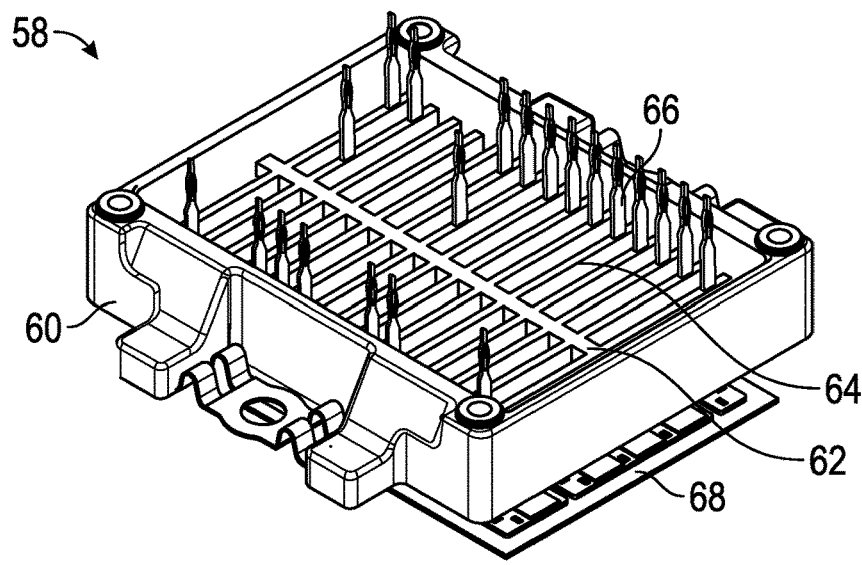
Figure 4E:
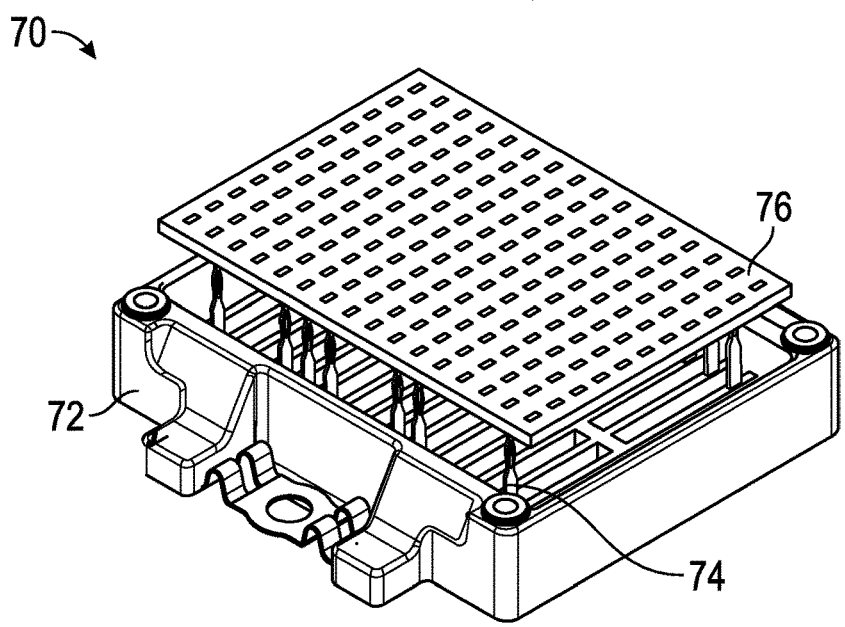
Figure 4F:
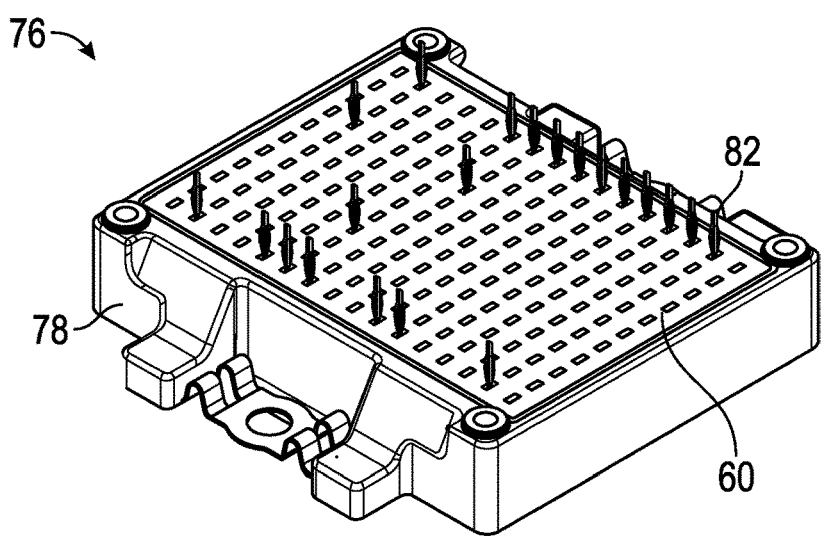

Referring to FIGS. 4A-4F, a method for manufacturing a semiconductor package is illustrated. FIG. 4A illustrates a substrate 44. The substrate 44 may be made of any material including copper, silicon, any combination thereof, or a ceramic or other electrically conductive/insulative material. FIG. 4B illustrates the addition of die 48 to the substrate 46. The die 48 can include, by non-limiting example, an insulated gate bipolar junction transistor (IGBT) a rectifier, a metal oxide field effect transistor (MOSFET), or any other semiconductor device. FIG. 4C illustrates the semiconductor package 50 with addition of connectors 56 to mechanically and electronically connect the die 54 to other die 48 and to the substrate 52. The connectors 56 may include a wire made of any electrically conductive material. FIG. 4D illustrates the semiconductor package 58 as case 60 that includes the plurality of pins molded into it is being coupled to the substrate 68. The case 60 is similar to that illustrated in FIGS. 3A and 3B. The case 60 has a strut 62 that extends from one side of an opening in the case to an opposite side of the opening. Extending from either side of the strut 62 are fingers 64. The fingers 64 extend from the strut 62 to the sides of the case 60. Embedded in the fingers 64 of the strut is a plurality of press-fit pins 66. The press-fit pins 66 are simultaneously electrically and mechanically coupled to the substrate 68 as the case 60 is coupled to the substrate 68 which may decrease the force exerted on the individual press-fit pins. FIG. 4E illustrates an optional step of coupling a cover 76 to the case 60. The cover 76 has holes therethrough formed in it that allow the press-fit pins 74 to pass through the cover 76. The cover 76 is placed over the press-fit pins and rests inside the case 72. In particular implementations, the cover rests on a flange formed around the opening in the cover. Before the cover 76 is added. a potting compound may be added through the opening within the case 72. FIG. 4F is an illustration of the finished semiconductor package 76. This method may allow for automation of semiconductor package manufacturing when using press-fit pins, as all of the pins may be simultaneously and mechanically coupled to the substrate when the case 60 is coupled to the substrate 68. This may eliminate the need to use fixtures of any kind to hold the pins individually or collectively to the substrate during manufacturing.

Figure 5A:
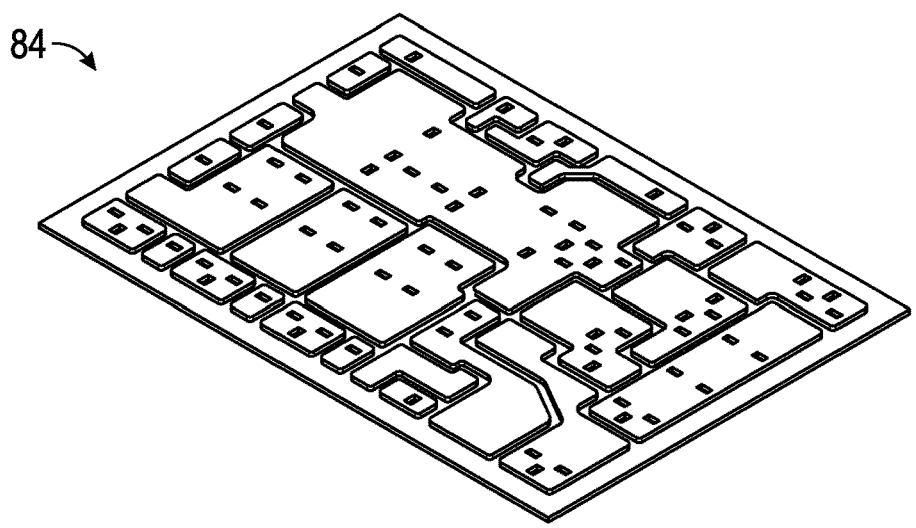
FIGS. 5A-5F shows an implementation of a method of making a semiconductor package with press-fit pins molded into a cover.
Figure 5B:
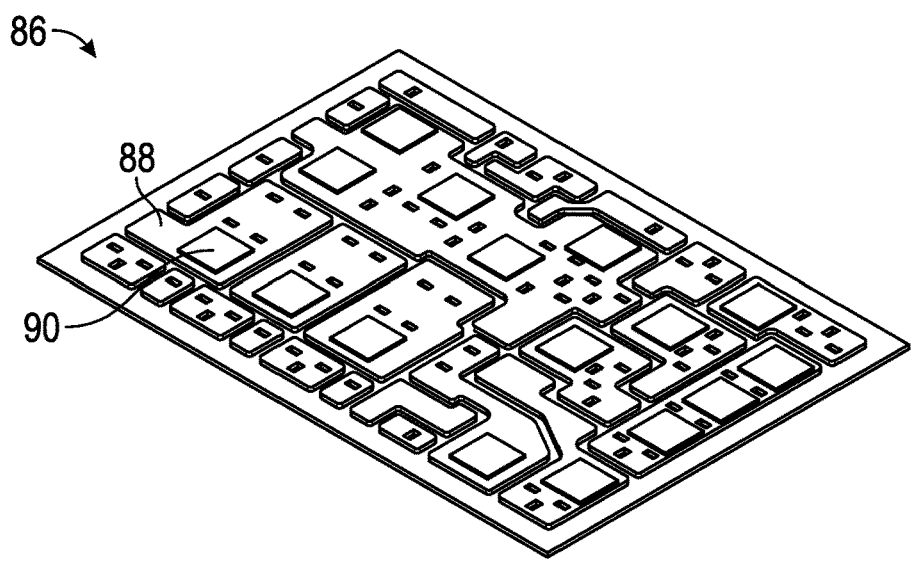
Figure 5C:
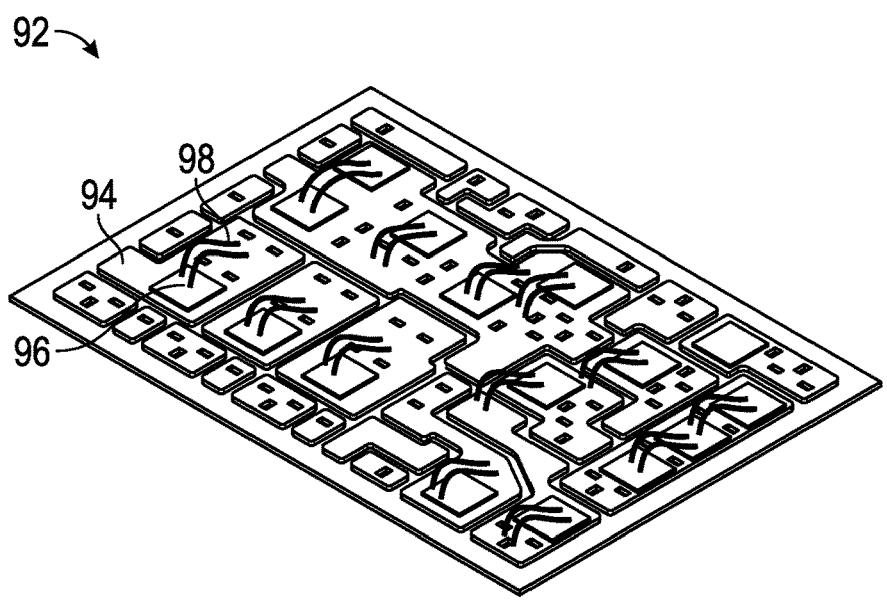
Figure 5D:
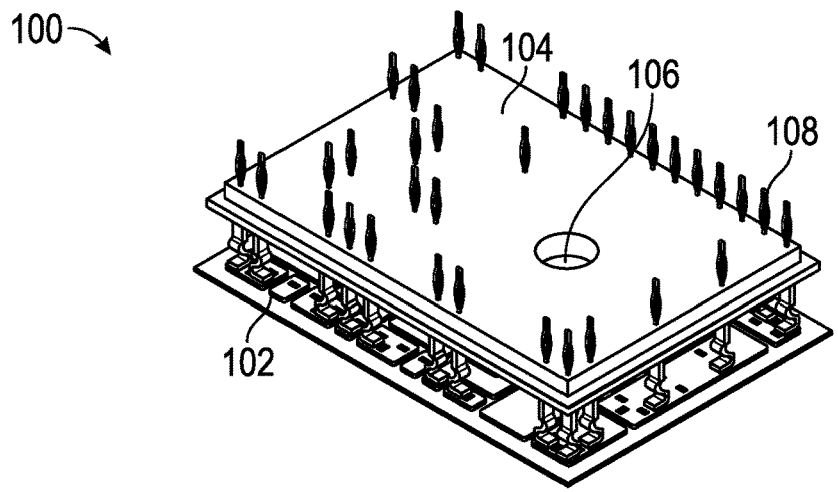
Figure 5E:
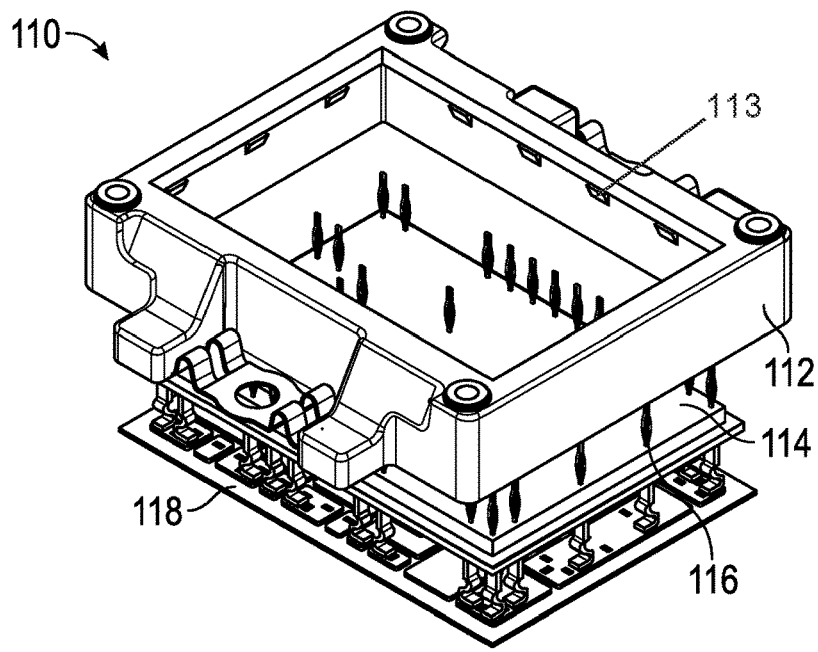
Figure 5F:
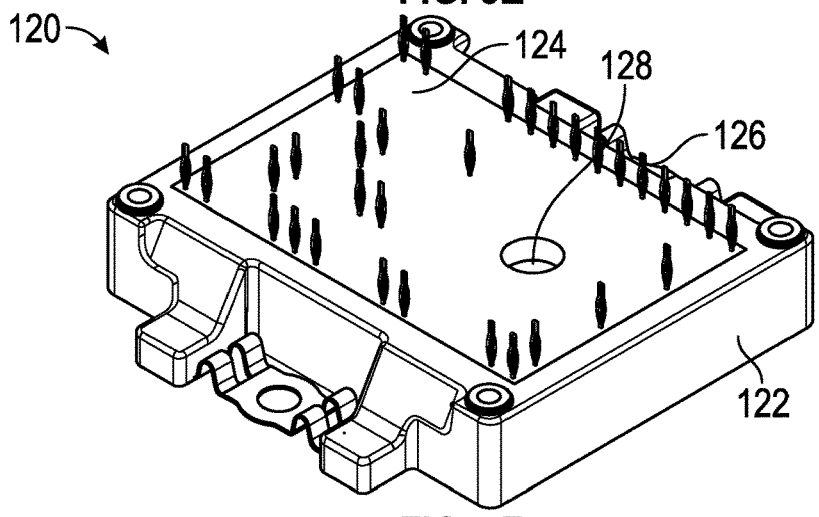

Referring to FIGS. 5A-5F, another implementation of a method of manufacturing a semiconductor package is illustrated. FIG. 5A illustrates a substrate 84. The substrate 84 may be made of any material including copper, silicon, ceramics, electrically conductive/insulative materials and any combination thereof. FIG. 5B illustrates the substrate following coupling of the die 90 to the substrate 88. The die 90 can include, by non-limiting example, an insulated gate bipolar junction transistor (IGBT) a rectifier, a metal oxide field effect transistor (MOSFET), or any other semiconductor device. FIG. 5C illustrates the semiconductor package 92 following coupling wires 98 to mechanically and electronically connect the die 96 to other die and to the substrate 94. FIG. 5D illustrates the semiconductor package following coupling of a cover 104 and press-fit pins 108 to the substrate 102. As can be seen from the figure, the press-fits pins 108 are molded into and fixedly coupled with the cover. When the cover is placed over the substrate the press-fit pins are electrically and mechanically coupled with the substrate 102. Also, they are automatically aligned to the specific locations on the substrate 102 to which they are to be bonded. The cover 104 includes an opening 106 to allow for the addition of potting compound. FIG. 5E illustrates the package after the case 112 has been coupled over the cover 104. The case 112 fits around and over the cover 114 with the embedded press-fit pins 116 and couples the cover 114 with the substrate 118. As illustrated, a flange extends around the perimeter of the cover 114 which engages with a corresponding flange around the opening of the case 112. In other implementations, however, the flange may be not be included and the cover 114 may merely be retained within the opening of the case 112. The case 112 may also include a plurality of locking projections 113 which engage with the one or more edges of the cover 114. The locking projections 113 may, in various implementations, irreversibly lock the cover 114 to the case 112. FIG. 5F illustrates an implementation of the finished semiconductor package 120. The case 122 is coupled to the cover 124 and the embedded press-fit pins 126 are coupled to the substrate 102. Potting compound can now optionally be added through the opening 128 in the cover 124. This method may also allow for automation of semiconductor package manufacturing when using press-fit pins by eliminating the need for a fixture to be used to hold all of the pins during the soldering step. Instead, this method implementation permits a single fixture to be used that holds the cover itself during the soldering/coupling step, which is much simpler mechanically.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method for making a semiconductor package, the method comprising:
   providing a substrate;
   coupling one or more die to the substrate using one or more connectors;
   providing a case;
   molding into the case and fixedly coupling thereto a plurality of pins;
   simultaneously electrically and mechanically coupling the plurality of pins and the case with the substrate; and
   dispensing a potting compound inside the case over at least a portion of the substrate.

2. The method of claim 1, wherein the case comprises an opening comprising a strut that extends from a side of the opening to another side of the opening and a first set of a plurality of fingers extending from the strut on one side of the strut and a second set of a plurality of fingers extending from an opposing side of the strut.

3. The method of claim 1, wherein a cover that has a plurality of openings therethrough configured to receive the plurality of pins is coupled to the case.

4. The method of claim 1, wherein the substrate comprises at least one of copper, silicon, and any combination thereof.

5. The method of claim 1, wherein the plurality of pins are fixedly coupled to the substrate through soldering.

6. The method of claim 1, wherein the one or more connectors comprise a wire.

7. A method for making a semiconductor package, the method comprising:
   providing a substrate;
   coupling one or more die to the substrate using one or more connectors;
   providing a cover for a case, the cover having a potting opening therein;
   molding into the cover and fixedly coupling thereto a plurality of pins;
   simultaneously electrically and mechanically coupling the plurality of pins and the cover to the substrate;
   coupling the case over the cover and to the substrate; and
   dispensing a potting compound into the case through the potting opening in the cover.

8. The method of claim 7, wherein a temporary fixture is used to hold the cover and the substrate together while coupling the plurality of pins and the cover to the substrate.

9. The method of claim 7, further comprising mechanically and irreversibly locking the cover with the case through a plurality of locking projections on the case.

10. The method of claim 7, wherein the substrate comprises at least one of copper, silicon, or any combination thereof.

11. The method of claim 7, wherein the plurality of pins are fixedly coupled to the substrate through soldering.

12. The method of claim 7, wherein the one or more connectors are made of a wire.

13. A method for making a semiconductor package, the method comprising:
   providing a substrate;
   coupling one or more die to the substrate using one or more connectors; and
   simultaneously coupling one of a plurality of pins and a cover to the substrate or the plurality of pins and a case to the substrate.

14. The method of claim 13, further comprising dispensing a potting compound into the case through a potting opening in the cover.

15. The method of claim 13, further comprising molding the plurality of pins into one of the cover or the case.

16. The method of claim 13, wherein the plurality of pins extend through a plurality of openings comprised in the cover.

17. The method of claim 13, further comprising mechanically and irreversibly locking the cover with the case through a plurality of locking projections on the case.

18. The method of claim 13, wherein the plurality of pins is fixedly coupled to one of the case or the cover prior to coupling the plurality of pins to the substrate.

19. The method of claim 13, wherein the substrate comprises of at least one of copper, silicon, and any combination thereof.

20. The method of claim 13, wherein the one or more connectors comprise a wire.

* * * * *